(12) United States Patent
Chuang

(10) Patent No.: US 11,973,045 B2
(45) Date of Patent: Apr. 30, 2024

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 261 days.

(21) Appl. No.: 17/650,796

(22) Filed: Feb. 11, 2022

(65) Prior Publication Data
US 2023/0005867 A1 Jan. 5, 2023

Related U.S. Application Data

(63) Continuation of application No. PCT/CN2021/113329, filed on Aug. 18, 2021.

(30) Foreign Application Priority Data

Jul. 1, 2021 (CN) .......................... 202110746139.0

(51) Int. Cl.
H01L 23/48 (2006.01)
H01L 21/78 (2006.01)
H01L 23/00 (2006.01)

(52) U.S. Cl.
CPC ............ H01L 24/08 (2013.01); H01L 23/481 (2013.01); H01L 24/03 (2013.01); H01L 24/05 (2013.01);
(Continued)

(58) Field of Classification Search
CPC . H01L 2224/80895; H01L 2224/08147; H01L 2224/039–05613; H01L 24/80; H01L 24/03; H01L 24/08
See application file for complete search history.

(56) References Cited

U.S. PATENT DOCUMENTS 5,745,987 A * 5/1998 Bartley .................. H05K 3/341
29/830
6,376,353 B1 4/2002 Zhou
(Continued)

FOREIGN PATENT DOCUMENTS

| CN | 103474420 A | 12/2013 |
| CN | 105280509 B | 4/2018 |

(Continued)

*Primary Examiner* — Hoa B Trinh
(74) *Attorney, Agent, or Firm* — Syncoda LLC; Feng Ma

(57) ABSTRACT

A semiconductor structure includes: a first substrate, with a first opening being provided on a surface of first substrate; and a first bonding structure positioned in the first opening. The first bonding structure includes a first metal layer and a second metal layer with a melting point lower than that of the first metal layer. The first metal layer includes a first surface in contact with a bottom surface of the first opening and a second surface opposite to the first surface, the second surface is provided with a first groove, an area, not occupied by the first metal layer and the first groove, of the first opening constitutes a second groove, the second metal layer is formed in the first groove and the second groove, and a surface, exposed from the second groove, of the second metal layer constitutes a bonding surface of the first bonding structure.

16 Claims, 21 Drawing Sheets

(52) U.S. Cl.
CPC ........ *H01L 24/80* (2013.01); *H01L 2224/039* (2013.01); *H01L 2224/05013* (2013.01); *H01L 2224/05015* (2013.01); *H01L 2224/05017* (2013.01); *H01L 2224/05073* (2013.01); *H01L 2224/05147* (2013.01); *H01L 2224/05184* (2013.01); *H01L 2224/05553* (2013.01); *H01L 2224/05555* (2013.01); *H01L 2224/05557* (2013.01); *H01L 2224/05573* (2013.01); *H01L 2224/05609* (2013.01); *H01L 2224/05611* (2013.01); *H01L 2224/05613* (2013.01); *H01L 2224/05616* (2013.01); *H01L 2224/08147* (2013.01); *H01L 2224/80895* (2013.01)

(56) References Cited

U.S. PATENT DOCUMENTS

| | | |
|---|---|---|
| 6,667,225 B2 | 12/2003 | Hau-Riege |
| 6,870,262 B2 | 3/2005 | Hau-Riege |
| 8,482,132 B2 | 7/2013 | Yang |
| 8,492,265 B2 | 7/2013 | Yang |
| 8,809,123 B2 | 8/2014 | Liu |
| 9,953,941 B2 | 4/2018 | Enquist |
| 10,262,963 B2 | 4/2019 | Enquist |
| 10,515,913 B2 | 12/2019 | Katkar |
| 10,790,248 B2 | 9/2020 | Chen |
| 10,790,262 B2 | 9/2020 | Uzoh |
| 11,088,099 B2 | 8/2021 | Katkar |
| 11,264,345 B2 | 3/2022 | Enquist |
| 2003/0113976 A1 | 6/2003 | Hau-Riege |
| 2004/0056073 A1 | 3/2004 | Hau-Riege |
| 2011/0084403 A1 | 4/2011 | Yang |
| 2012/0190187 A1 | 7/2012 | Yang |
| 2013/0320556 A1 | 12/2013 | Liu |
| 2017/0062366 A1 | 3/2017 | Enquist |
| 2018/0226371 A1 | 8/2018 | Enquist |
| 2018/0269172 A1 | 9/2018 | Katkar et al. |
| 2019/0237419 A1 | 8/2019 | Enquist |
| 2019/0319007 A1 | 10/2019 | Uzoh et al. |
| 2020/0105692 A1 | 4/2020 | Katkar et al. |
| 2020/0235063 A1 | 7/2020 | Chen et al. |
| 2020/0381389 A1 | 12/2020 | Uzoh et al. |
| 2021/0335737 A1 | 10/2021 | Katkar et al. |
| 2021/0375790 A1* | 12/2021 | Oda ............... H01L 24/80 |
| 2022/0149002 A1* | 5/2022 | Hou ............... H01L 25/18 |
| 2022/0328447 A1* | 10/2022 | Kao ............... H01L 23/5283 |

FOREIGN PATENT DOCUMENTS

| | | |
|---|---|---|
| CN | 108140559 A | 6/2018 |
| CN | 111477603 A | 7/2020 |
| CN | 111801793 A | 10/2020 |
| TW | I725927 B | 4/2021 |

\* cited by examiner

A first substrate is provided, In which a first opening is formed on the surface of the first substrate ⎯ 801

A first bonding structure is formed in the first opening, in which the first bonding structure includes a first metal layer and a second metal layer with a melting point lower than that of the first metal layer; and the formation of the first bonding structure includes: forming the first metal layer in the first opening, in which the first metal layer includes a first surface in contact with a bottom surface of the first opening and a second surface opposite to the first surface; forming a first groove on the second surface, in which an area, not occupied by the first metal layer and the first groove, of the first opening constitutes a second groove; and forming a second metal layer in the first groove and the second groove, in which a surface, exposed from the second groove, of the second metal layer constituting a bonding surface of the first bonding structure ⎯ 802

FIG. 8

SEMICONDUCTOR STRUCTURE AND METHOD FOR FORMING SAME

CROSS-REFERENCE TO RELATED APPLICATIONS

This is a continuation of International Application No. PCT/CN2021/113329 filed on Aug. 18, 2021, which claims priority to Chinese Patent Application No. 202110746139.0 filed on Jul. 1, 2021. The disclosures of these applications are hereby incorporated by reference in their entirety.

BACKGROUND

The three dimensional integrated circuit (3D IC) can improve the packaging density and the circuit working speed and realize novel multifunctional devices and circuit systems. Now various semiconductor manufacturers are dedicated to researches on the 3D IC.

SUMMARY

The disclosure relates to, but is not limited to a semiconductor structure and a method for forming same.

An embodiment of the disclosure provides a semiconductor structure, which includes: a first substrate, with a first opening being provided on a surface of the first substrate; and a first bonding structure, positioned in the first opening. The first bonding structure includes a first metal layer and a second metal layer with a melting point lower than that of the first metal layer. The first metal layer includes a first surface in contact with a bottom surface of the first opening and a second surface opposite to the first surface. A first groove is provided on a surface of the second surface, and an area, not occupied by the first metal layer and the first groove, of the first opening constitutes a second groove. A second metal layer is formed in the first groove and the second groove, and a surface, exposed from the second groove, of the second metal layer constitutes a bonding surface of the first bonding structure.

An embodiment of the disclosure provides a method for forming a semiconductor structure, the method includes the following operations. A first substrate is provided, in which a first opening is formed in a surface of the first substrate. A first bonding structure is formed in the first opening, in which the first bonding structure includes a first metal layer and a second metal layer with a melting point lower than that of the first metal layer. The operation that the first bonding structure is formed includes: forming the first metal layer in the first opening, in which the first metal layer includes a first surface in contact with a bottom surface of the first opening and a second surface opposite to the first surface; forming a first groove on the second surface, in which an area, not occupied by the first metal layer and the first groove, of the first opening constitutes a second groove; and forming the second metal layer in the first groove and the second groove, in which a surface, exposed from the second groove, of the second metal layer constitutes a bonding surface of the first bonding structure.

BRIEF DESCRIPTION OF THE DRAWINGS

FIG. 8 illustrates a flowchart of a method for forming a semiconductor structure according to an embodiment of the disclosure.

DETAILED DESCRIPTION

Figure 1:
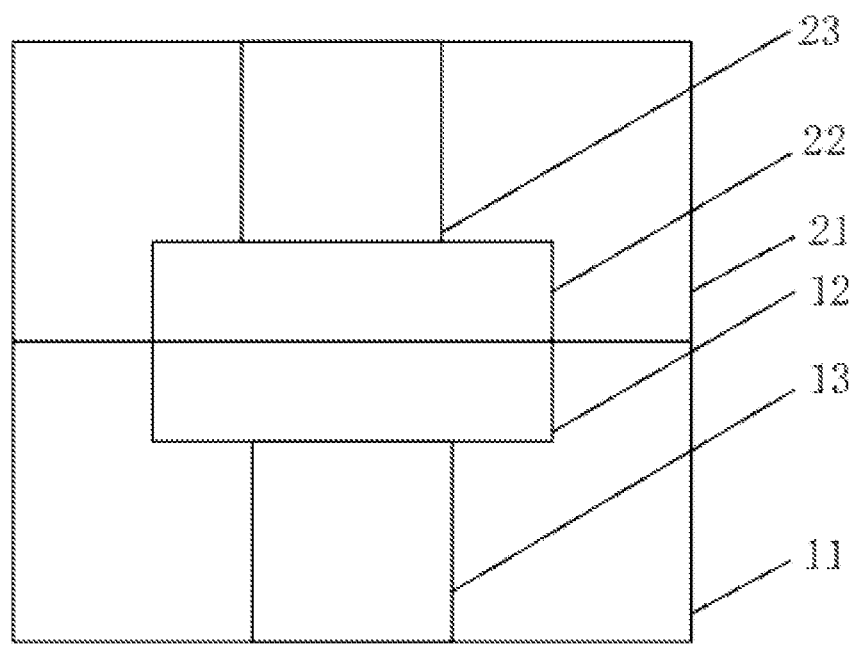
FIG. 1 illustrates a schematic diagram of a semiconductor structure.

Exemplary embodiments disclosed in the disclosure will be described in more detail below with reference to the drawings. While exemplary embodiments of the disclosure are shown in the drawings, it should be understood that the disclosure may be implemented in various forms and should not be limited by the specific embodiments illustrated herein. Rather, these embodiments are provided so that the disclosure will be thoroughly understood, and the scope of the disclosure can be fully conveyed to those skilled in the art.

In the following description, numerous specific details are provided in order to make the disclosure understood thoroughly. It is apparent, however, to those skilled in the art, that the disclosure may be implemented without one or more of these specific details. In other examples, well-known features are not described in order to avoid obscuring the disclosure, that is, not all features of actual embodiments are described herein, and well-known functions and constructions are not described in detail.

In the drawings, the size of layers, areas, elements, and relative sizes may be exaggerated for clarity. Same reference numerals designate the same elements.

It should be understood that when an element or layer is referred to as being "on", "adjacent to", "connected to" or "coupled to" another element or layer, the element or layer can be directly on, adjacent to, connected to or coupled to another element or layer or there may be intervening elements or layers. In contrast, when an element is referred to as being "directly on", "directly adjacent to", "directly connected to" or "directly coupled to" other elements or layers, there are no intervening elements or layers. It should be understood that, although the terms "first", "second", "third", etc. may be used to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section illustrated below may be termed as a second element, component, area, layer or section without departing from the teachings of the disclosure. The illustration of a second element, component, area, layer or section does not necessarily imply that a first element, component, area, layer or section is necessarily present in the disclosure.

Spatially relative terms, such as "under", "below", "lower", "beneath", "above", "over" and "upper" and the like, may be used herein for ease of description to describe one element or feature's relationship to another element or feature as illustrated in the drawings. It should be understood that the spatially relative terms are intended to include various orientations of a device in use or operation in addition to the orientations illustrated in the drawings. For example, if the device in the drawings is turned over, elements or features described as "below", "beneath", or "under" other elements or features may then be oriented "above" or "over" other elements or features. Thus, the exemplary terms "below" and "under" may include both an upper and a lower orientation. The device may be otherwise oriented (rotated 90 degrees or at other orientations) and the spatially relative terms used herein are illustrated accordingly.

The terms used herein is for the purpose of describing specific embodiments only and is not intended to be limiting of the disclosure. As used herein, the singular forms "a/an", "one" and "the" are intended to include the plural forms as well, unless the context clearly indicates otherwise. It should be further understood that the terms "comprising" and/or "including," when used in the specification, specify the presence of stated features, integers, steps, operations, elements, and/or components, but do not exclude the presence or addition of one or more other features, integers, steps, operations, elements, components, and/or groups thereof. As used herein, the term "and/or" includes any and all combinations of the associated listed items.

3D ICs need wafer-to-wafer bonding, which is mainly achieved by copper-copper bonding.

The copper-copper bonding may be failure, and the bonding performance further needs to be improved.

As shown in FIG. 1, the semiconductor structure includes a first substrate 11, a first bonding structure 12 formed in the first substrate 11, a first conductive via hole 13 formed in the first substrate 11 and connected to the first bonding structure 12, a second substrate 21, a second bonding structure 22 formed in the second substrate 21, and a second conductive via hole 23 formed in the second substrate 21 and connected to the second bonding structure 22. The material of the first bonding structure 12 is copper, the material of the second bonding structure 22 is copper as well, and a copper-copper bonding is formed between the first bonding structure 12 and the second bonding structure 22.

However, copper-copper bonding requires mutual bonding is performed at a high temperature of 400° C., in which the temperature for bonding is high, which limits the selection of many materials and processes and may cause the disadvantage of deviation of device characteristics. In addition, the copper-copper bonding has a relatively high requirement on surface flatness, which increases the difficulty of processes of the manufacture.

In order to solve the problems, the following technical scheme of embodiments of the disclosure is provided.

An embodiment of the disclosure provides a semiconductor structure, which includes: a first substrate, with a first opening being provided on a surface of the first substrate; and a first bonding structure positioned in the first opening. The first bonding structure includes a first metal layer and a second metal layer with a melting point lower than that of the first metal layer. The first metal layer includes a first surface in contact with a bottom surface of the first opening and a second surface opposite to the first surface. A first groove is provided on the second surface, an area, not occupied by the first metal layer and the first groove, of the first opening constitutes a second groove, the second metal layer is formed in the first groove and the second groove, and a surface, exposed from the second groove, of the second metal layer constitutes a bonding surface of the first bonding structure.

The first bonding structure according to the embodiment of the disclosure includes a second metal layer with a relatively low melting point, and compared with other bonding structures only including the first metal layer, the first bonding structure provided by the embodiment of the disclosure can be bonded at a lower temperature. Meanwhile, when the first bonding structure is bonded, the second metal layer in a molten state can better fill a gap between the first bonding structure and another bonding structure, such that requirement on the flatness of the bonding surface during bonding is lowered.

In order to make the foregoing objectives, features and advantages of the disclosure more clear and easily understood, implementations are illustrated in detail with reference with the drawings below. In describing the embodiments of the disclosure in detail, the schematic diagrams are not partially enlarged according to a scale, and the schematic diagrams are merely exemplary and should not be construed as limiting the scope of the disclosure.

Figure 2:
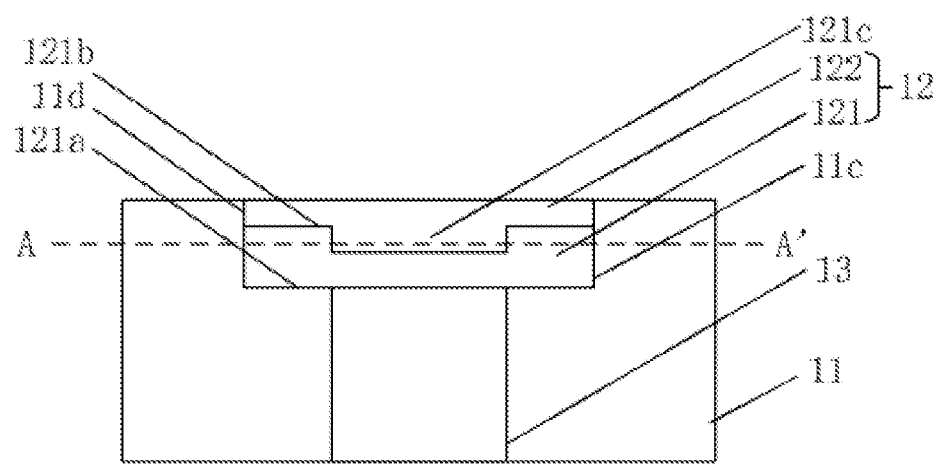
FIG. 2 illustrates a schematic diagram of a semiconductor structure according to an embodiment of the disclosure.

FIG. 2 is a schematic diagram of a semiconductor structure according to an embodiment of the disclosure. As shown in FIG. 2, the semiconductor structure includes a first substrate 11, with a first opening 11c being provided on a surface of the first substrate 11; and a first bonding structure 12, positioned in the first opening 11c. The first bonding structure includes a first metal layer 121 and a second metal layer 122 with a melting point lower than that of the first metal layer 121. The first metal layer 121 includes a first surface 121a in contact with a bottom surface of the first opening 11c and a second surface 121b opposite to the first surface 121a. A first groove 121c is provided on the second surface 121b, an area, not occupied by the first metal layer 121 and the first groove 121c, of the first opening 11c constitutes a second groove 11d, the second metal layer 122 is formed in the first groove 121c and the second groove 11d, and a surface, exposed from the second groove 11d, of the second metal layer 122 constitutes a bonding surface of the first bonding structure 12.

It should be understood that the bonding surface of the first bonding structure 12 refers to a surface, bonded and connected with another bonding structure during bonding, of the first bonding structure 12. In an embodiment, the shape of the bonding surface of the first bonding structure 12 includes, but is not limited to, circular, oval or rectangular ones.

The material of the first substrate 11 may be silicon, germanium, gallium nitride, gallium arsenide, indium phosphide (InP), silicon on insulator (SOI), germanium on insulator (GeOI), etc., but is not limited thereto, and may be other materials which may be used as a substrate.

In an embodiment, the first metal layer 121 includes, but is not limited to, at least one of copper or tungsten.

In an embodiment, the second metal layer 122 includes, but is not limited to, at least one of bismuth, cadmium, tin, lead, dysprosium or indium.

In an embodiment, the semiconductor structure further includes: a first conductive via hole 13, positioned in the first substrate 11. The first conductive via hole 13 is connected to the first bonding structure 12, and the projection of the first conductive via hole 13 and the projection of a first groove 121c on the first surface 121a in the direction perpendicular to the first surface 121a coincide. In other words, the cross section, parallel to the first surface 121a, of the first conductive via hole 13 and the cross section, parallel to the first surface 121a, of the first groove 121c have the same shape and size. In this way, the thermal expansion thrust of the first conductive via hole 13 to a second metal layer 122 in a molten state during bonding can be increased, and the bonding reliability can be improved.

In a specific embodiment, the first conductive via hole 13 and the first groove 121c are cylindrical, and the diameter of the first groove 121c is the same as that of the first conductive via hole 13.

The first conductive via hole 13 includes, but is not limited to a TSV (Through Silicon Via), and the first conductive via hole 13 is used to transfer electrical signals.

In specific embodiment, the material of the first conductive via hole 13 is the same as that of the first metal layer 121.

In a specific embodiment, the material of the first conductive via hole 13 includes, but is not limited to, copper.

FIGS. 3A-3D are cross-sectional diagrams taken along the dotted line A-A' of FIG. 2. As shown in FIGS. 3A-3D, the opening shape of the first groove 121c includes circular or rectangular ones; and the outer contour shape of the second surface 121b of the first metal layer 121 includes circular or rectangular ones.

Figure 3A:
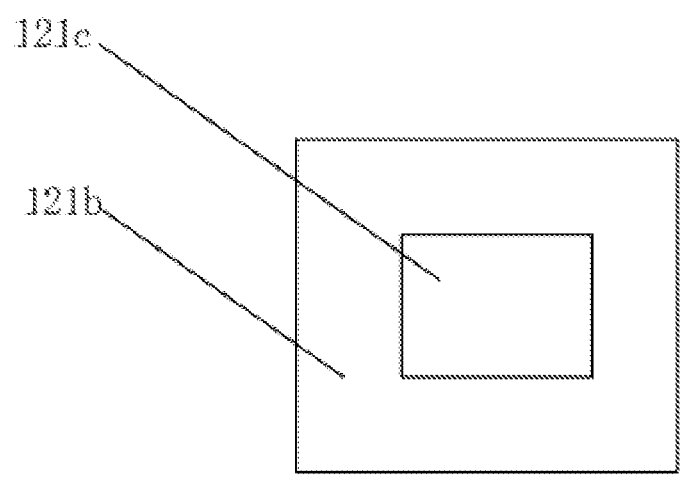
FIG. 3A illustrates a first cross-sectional diagram taken along the dotted line A-A' of FIG. 2.

In a specific embodiment, the opening shape of the first groove 121c is rectangular, and the outer contour shape of the second surface 121b of the first metal layer 121 is rectangular, as shown in FIG. 3A.

Figure 3B:
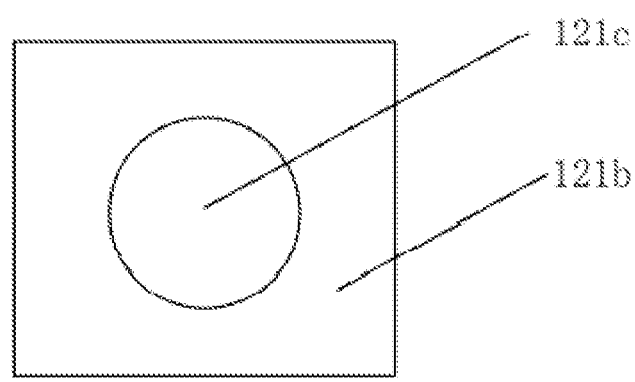
FIG. 3B illustrates a second cross-sectional diagram taken along the dotted line A-A' of FIG. 2.

In a specific embodiment, the opening shape of the first groove 121c is circular, and the outer contour shape of the second surface 121b of the first metal layer 121 is rectangular, as shown in FIG. 3B.

Figure 3C:
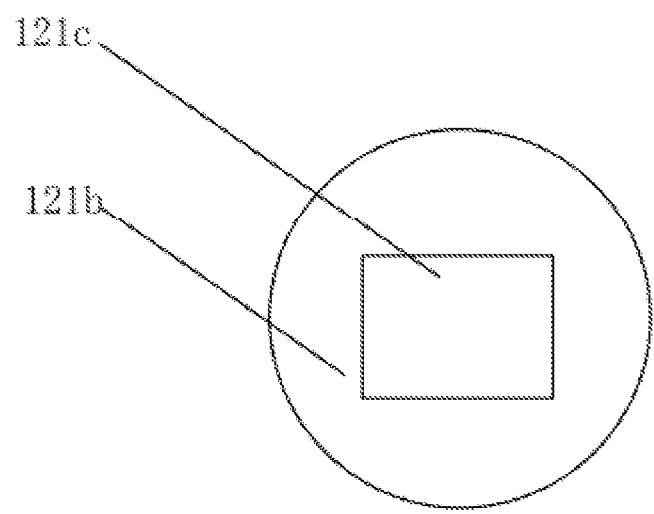
FIG. 3C illustrates a third cross-sectional diagram taken along the dotted line A-A' of FIG. 2.

In a specific embodiment, the opening shape of the first groove 121c is rectangular, and the outer contour shape of the second surface 121b of the first metal layer 121 is circular, as shown in FIG. 3C.

Figure 3D:
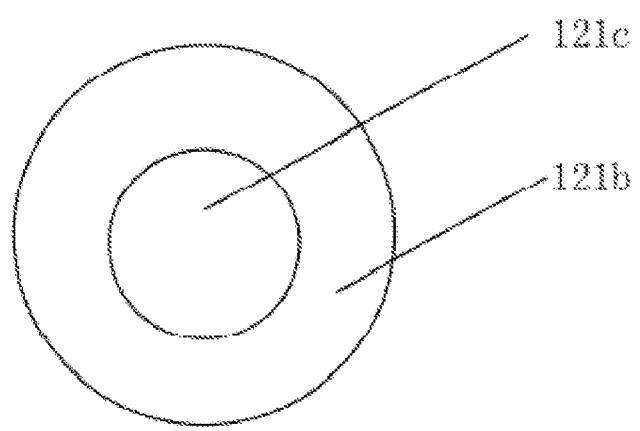
FIG. 3D illustrates a fourth cross-sectional diagram taken along the dotted line A-A' of FIG. 2.

In a specific embodiment, the opening shape of the first groove 121c is circular, and the outer contour shape of the second surface 121b of the first metal layer 121 is circular, as shown in FIG. 3D.

Figure 4:
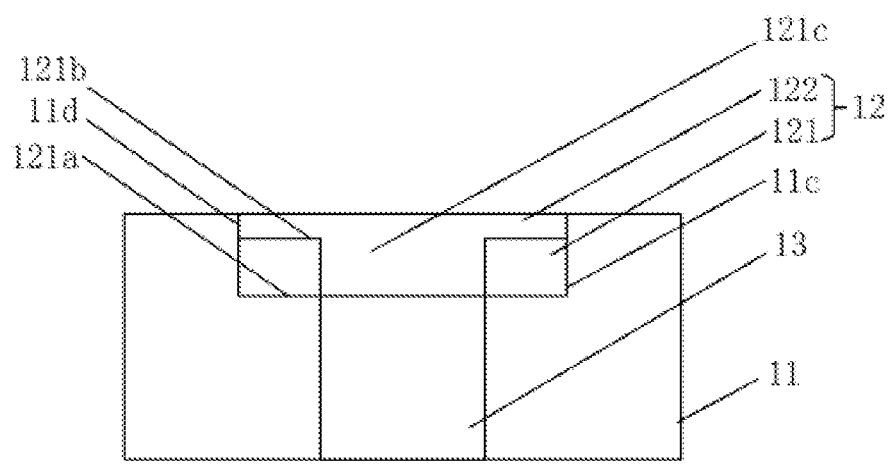
FIG. 4 illustrates a schematic diagram of a first groove penetrating a first metal layer according to an embodiment of the disclosure.

In an embodiment, the first groove 121c penetrates the first metal layer 121, and the second metal layer 122 positioned in the first groove 121c is directly connected to the first conductive via hole 13, as shown in FIG. 4.

Figure 5:
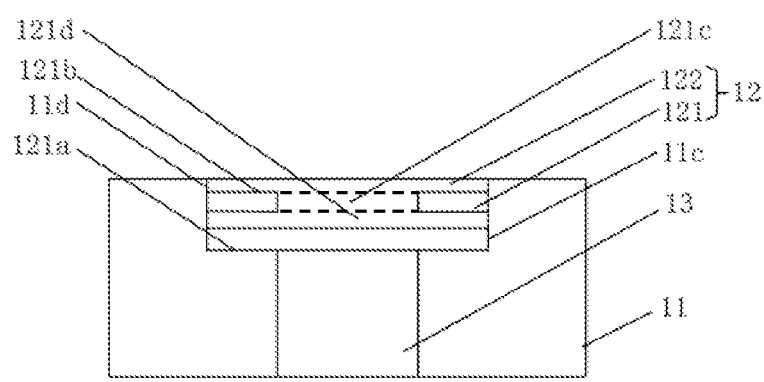
FIG. 5 illustrates a schematic diagram of a first metal layer with a third groove provided therein according to an embodiment of the disclosure.

In an embodiment, the first metal layer 121 further includes a third groove 121d below the first groove 121c, a projection of the first groove 121c on a first surface 121a falls within a projection of the third groove on the first surface, and the second metal layer 122 is formed in the third groove 121d, as shown in FIG. 5. When the first bonding structure 12 is bonded to another bonding structure, the third groove 121d can increase the flow rate of the second metal layer in a molten state 122 which is pushed to another bonding structure, so as to ensure that the second metal layer 122 is in full contact with another bonding structure, improving success rate of the bonding, and reducing the requirement on flatness of a bonding surface during bonding.

Figure 6:
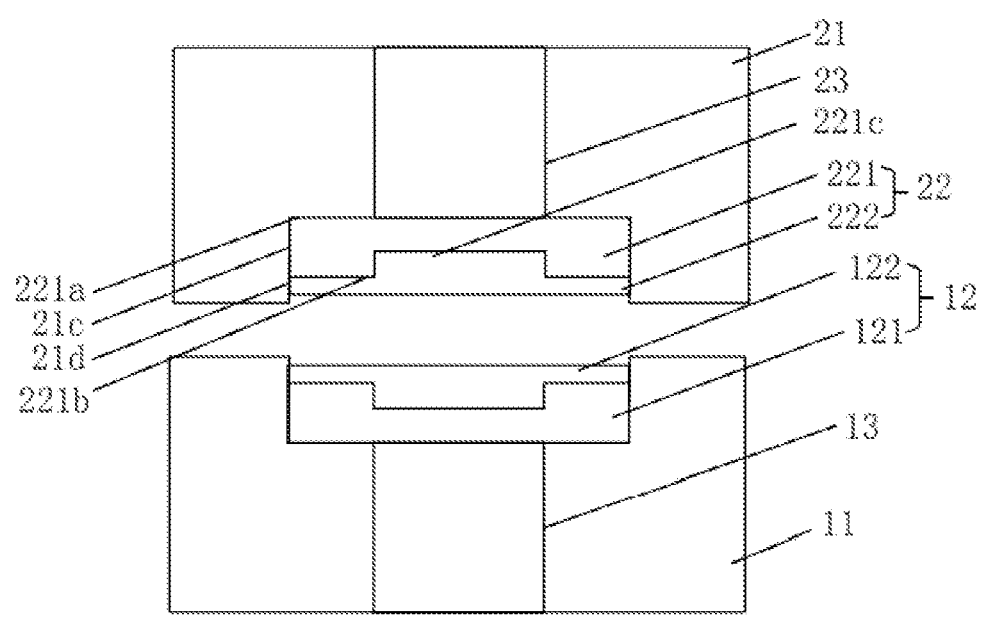
FIG. 6 illustrates a schematic diagram of a semiconductor structure with a second substrate according to an embodiment of the disclosure.

With reference to FIG. 6, in an embodiment, the semiconductor structure further includes a second substrate 21, with a second opening 21c being provided on a surface of the second substrate 21; and a second bonding structure 22 positioned in the second opening 21c, for being bonded to the first bonding structure 12.

The second bonding structure 22 includes a third metal layer 221, and a material of the third metal layer 221 is the same as that of a first metal layer 121; and the third metal layer 221 includes a third surface 221a in contact with a bottom surface of the second opening 21c and a fourth surface 221b opposite to the third surface 221a.

In an embodiment, the second bonding structure 22 further includes a fourth metal layer 222, a material of which is the same as that of the second metal layer 122.

The fourth surface 221b of a third metal layer 221 is provided with a fourth groove 221c, an area, not occupied by the third metal layer 221 and the fourth groove 221c, of a second opening 21c constitutes a fifth groove 21d, the fourth metal layer 222 is positioned in the fourth groove 221c and the fifth groove 21d, and the surface, exposed from the fifth groove 21d, of the fourth metal layer 222 constitutes a bonding surface of the second bonding structure 22.

It should be understood that the bonding surface of the second bonding structure 22 refers to the surface, bonded and connected with another bonding structure during bonding, of the second bonding structure 22. In an embodiment, a bonding surface of the first bonding structure 12 and a bonding surface of the second bonding structure 22 have the same shape and area. But not limited thereto, in other embodiments, the shape and size of a bonding surface of a second bonding structure 22 and the shape and size of a bonding surface of a first bonding structure 12 may also be different.

In an embodiment, the fourth metal layer 222 does not completely fill the fifth groove 21d, and the distance between the surface, exposed from the fifth groove 21d, of the fourth metal layer 222 and the surface of the second substrate 21 is 1 nm-5 nm. The presence of the distance may allow for volume expansion of a third metal layer 221 during bonding, thus improving the bonding reliability.

In an embodiment, a second metal layer 122 does not completely fill a second groove 11d, and the distance between the surface, exposed from the second groove 11d, of the second metal layer 122 and the surface of a first substrate 11 is 1 nm-5 nm. The presence of the distance may allow for volume expansion of a first metal layer 121 during bonding, thus improving the bonding reliability.

In an embodiment, the semiconductor structure further includes a second conductive via hole 23 formed in the second substrate 21, and the second conductive via hole 23 is connected to the second bonding structure 22.

In a specific embodiment, the projection of the second conductive via hole 23 and the projection of the fourth groove 221c on the third surface 221a in the direction perpendicular to the third metal layer 221 coincide. In this way, the thermal expansion thrust of the second conductive via hole 23 to the fourth metal layer 222 in a molten state during bonding can be increased, thereby improving the bonding reliability.

Figure 7:
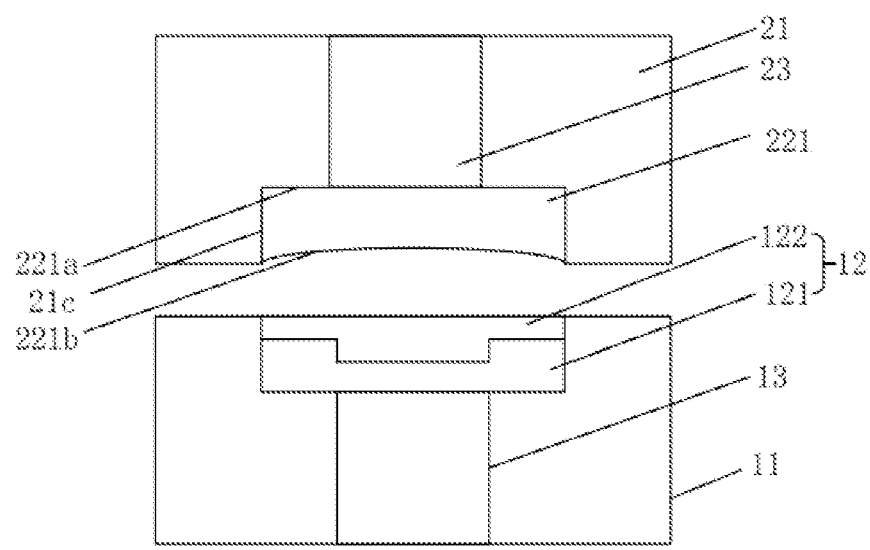
FIG. 7 illustrates a schematic diagram of a third metal layer provided with a concave second surface according to an embodiment of the disclosure.

With reference to FIG. 7, in an embodiment, the fourth surface 221b of the third metal layer 221 has a concave shape. In a specific embodiment, the concave shape includes, but is not limited to a spherical concave.

When the third metal layer 221 is bonded to the first bonding structure 12, the first metal layer 121 and/or the first conductive via hole 13 expand due to heating, and the second metal layer 122 in a molten state is pushed to fuse with the fourth surface 221b of the third metal layer 221 to form an intermetallic compound, so that the bonding strength is increased. Meanwhile, since the second metal layer 122 in the molten state has fluidity, the second metal layer 122 can fill up the space formed by the concave, and the bonding reliability cannot be affected when the bonding surface is a concave shape.

In order to ensure the bonding reliability, the depth of the concave shape should not be too large. In some embodiments, the maximum depth of the concave shape is 1 nm-5 nm.

An embodiment of the disclosure further provides a method for forming a semiconductor structure. As shown in FIG. 8, the method includes the following operations.

Operation 801, a first substrate is provided, and a first opening is formed on a surface of the first substrate.

Operation 802, a first bonding structure is formed in the first opening, and the first bonding structure includes a first metal layer and a second metal layer with a melting point lower than that of the first metal layer. The operation that the first bonding structure is formed includes: forming a first metal layer in the first opening, in which the first metal layer includes a first surface in contact with a bottom surface of the first opening and a second surface opposite to the first surface; forming a first groove on the second surface, in which the area, not occupied by the first metal layer and the first groove, of the first opening constitutes a second groove; and forming a second metal layer in the first groove and the second groove, in which a surface, exposed from the second groove, of the second metal layer constituting a bonding surface of the first bonding structure.

Then, the method for forming a semiconductor structure according to embodiments of the disclosure will be described in further detail with reference to FIG. 9A to 9J.

Figure 9A:
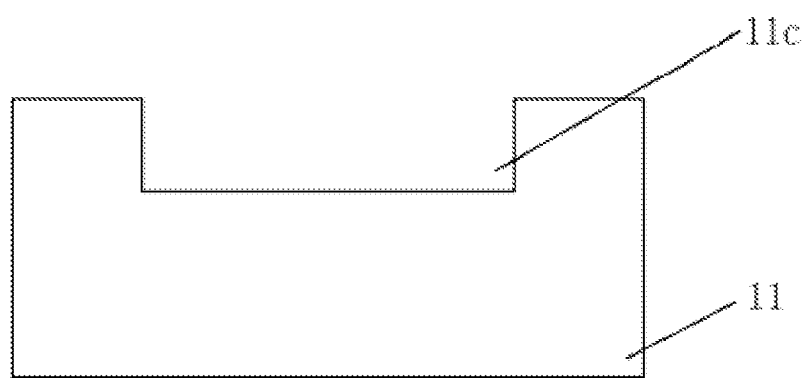
FIG. 9A illustrates a first process flow diagram of a method for forming a semiconductor structure according to embodiments of the disclosure.

First, operation 801 is performed, that is, a first substrate 11 is provided, and a first opening 11c is formed on a surface of the first substrate 11, as shown in FIG. 9A.

The material of the first substrate 11 may be silicon, germanium, gallium nitride, gallium arsenide, indium phosphide (InP), silicon on insulator (SOI), germanium on insulator (GeOI), etc., but is not limited thereto, and may be other materials which can be used as a substrate.

Figure 9B:
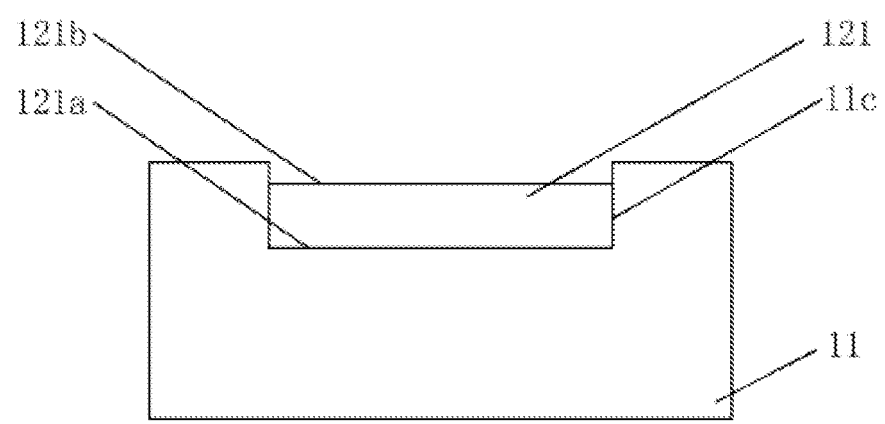
FIG. 9B illustrates a second process flow diagram of a method for forming a semiconductor structure according to embodiments of the disclosure.
Figure 9C:
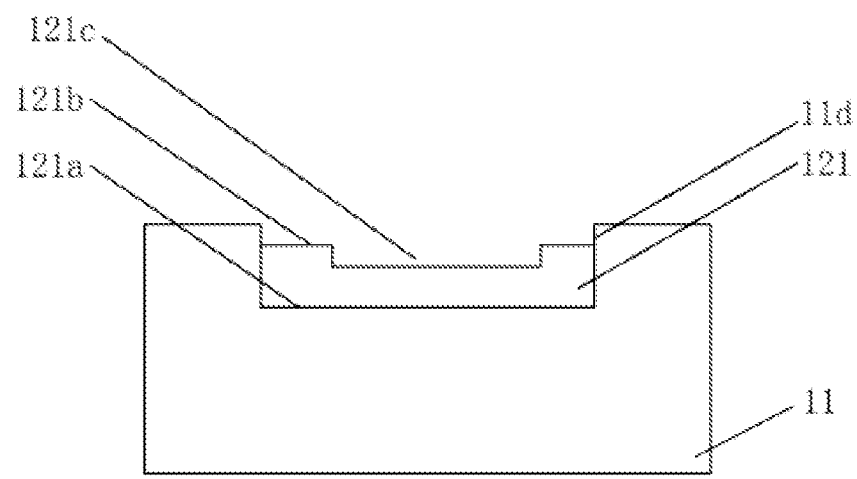
FIG. 9C illustrates a third process flow diagram of a method for forming a semiconductor structure according to embodiments of the disclosure.
Figure 9D:
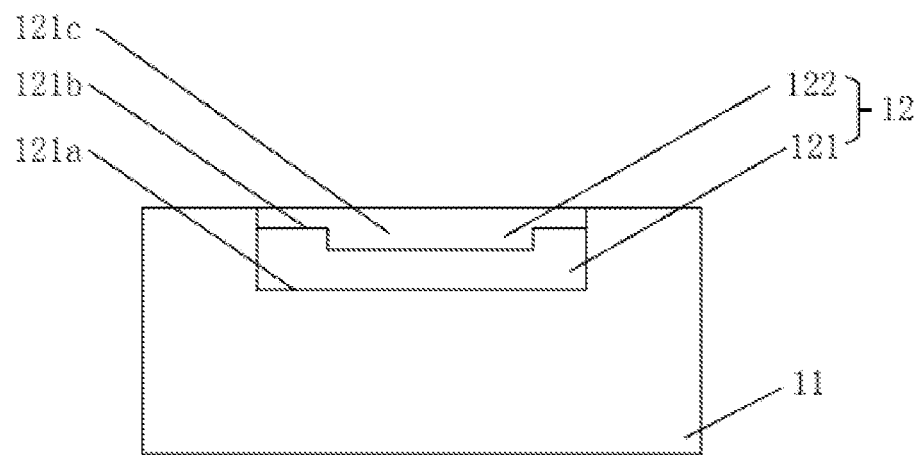
FIG. 9D illustrates a fourth process flow diagram of a method for forming a semiconductor structure according to embodiments of the disclosure.

Next, operation 802 is performed, that is, a first bonding structure 12 is formed in the first opening 11c, and the first bonding structure 12 includes a first metal layer 121 and a second metal layer 122 with a melting point lower than that of the first metal layer 121, as shown in FIG. 9B to 9D.

With reference to FIG. 9B, the first metal layer 121 is formed in the first opening 11c, and the first metal layer 121 includes a first surface 121a in contact with a bottom surface of the first opening 11c and a second surface 121b opposite to the first surface 121a.

With reference to FIG. 9C, a first groove 121c is formed on the second surface 121b of the first metal layer 121, and the area, not occupied by the first metal layer 121 and the first groove 121c, of the first opening 11c constitutes a second groove 11d.

With reference to FIG. 9D, the second metal layer 122 is formed in the first groove 121c and the second groove 11d, and a surface, exposed from the second groove 11d, of the second metal layer 122 constitutes a bonding surface of the first bonding structure 12.

Figure 9E:
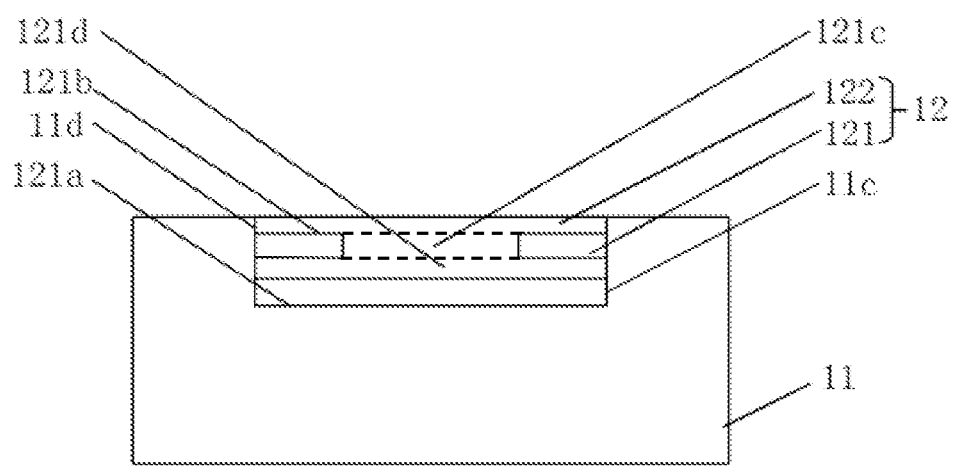
FIG. 9E illustrates a fifth process flow diagram of a method for forming a semiconductor structure according to embodiments of the disclosure.

In an embodiment, said forming a first bonding structure 12 further includes: forming a third groove 121d below the first groove 121c of the first metal layer 121. The projection of the first groove 121c on the first surface 121a falls within the projection of the third groove 121d on the first surface 121a, and the second metal layer 122 is formed in the third groove 121d, as shown in FIG. 9E.

Figure 9F:
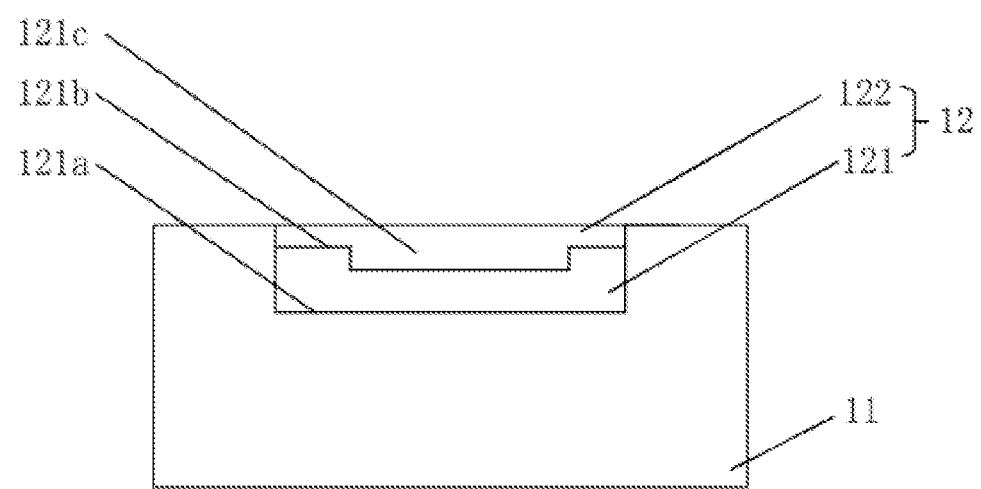
FIG. 9F illustrates a sixth process flow diagram of a method for forming a semiconductor structure according to embodiments of the disclosure.

In an embodiment, the method for forming a semiconductor structure further includes: forming a first conductive via hole 13 in the first substrate 11. The projection of the first conductive via hole 13 and the projection of a first groove 121c on the first surface 121a in the direction perpendicular to the first surface 121a coincide, as shown in FIG. 9F.

As shown in FIGS. 9G-9K, in an embodiment, the method for forming a semiconductor structure further includes: providing a second substrate 21 with a second opening 21c being provided on a surface of the second substrate 21; forming a second bonding structure 22 in the second opening 21c; and bonding the second bonding structure 22 to the first bonding structure 12.

Figure 9G:
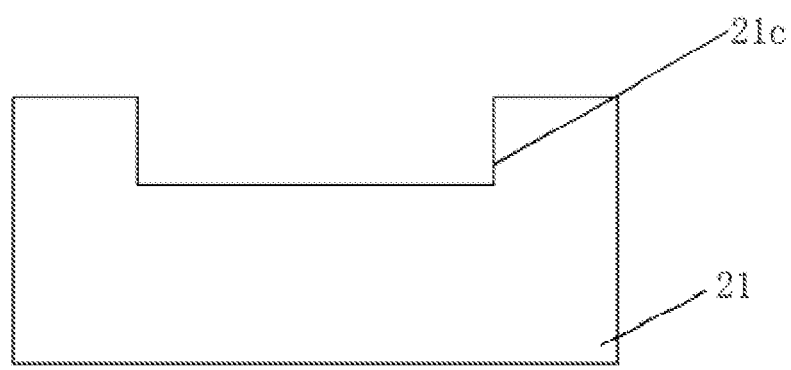
FIG. 9G illustrates a seventh process flow diagram of a method for forming a semiconductor structure according to embodiments of the disclosure.

With reference to FIG. 9G, the second substrate 21 is provided, with the second opening 21c being provided on the surface of the second substrate 21.

The material of the second substrate 21 may be silicon, germanium, gallium nitride, gallium arsenide, indium phosphide (InP), silicon on insulator (SOI), germanium on insulator (GeOI), etc., but is not limited thereto, and may be other materials which can be used as a substrate.

In an embodiment, the material of the second substrate 21 is the same as that of the first substrate 11. But not limited thereto, the material of the second substrate 21 may be different from that of the first substrate 11.

Figure 9H:
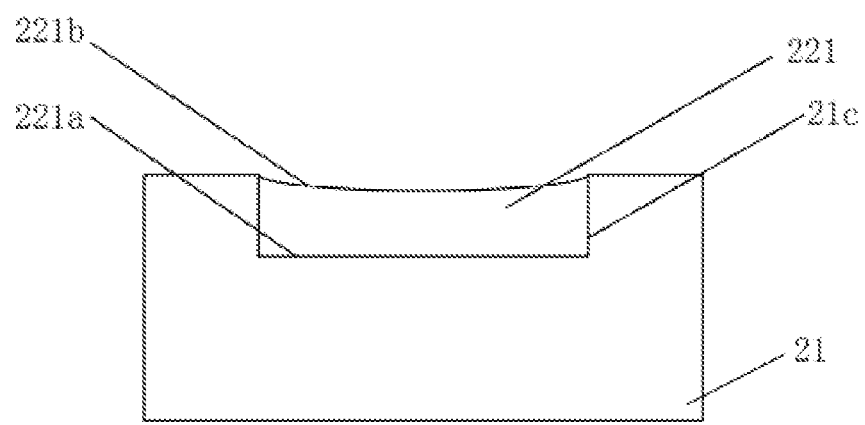
FIG. 9H illustrates an eighth process flow diagram of a method for forming a semiconductor structure according to embodiments of the disclosure.

In an embodiment, forming the second bonding structure 22 includes: forming a third metal layer 221, in which the material of the third metal layer 221 is the same as that of the first metal layer 121, and the third metal layer 221 includes a third surface 221a in contact with a bottom surface of the second opening 21c and a fourth surface 221b opposite to the third surface 221a. In a specific embodiment, the third metal layer 221 substantially fills the second opening 21c, and the fourth surface 221b constitutes a bonding surface of the second bonding structure 22. In a more specific embodiment, the fourth surface 221b has concave shape, as shown in FIG. 9H.

Figure 9I:
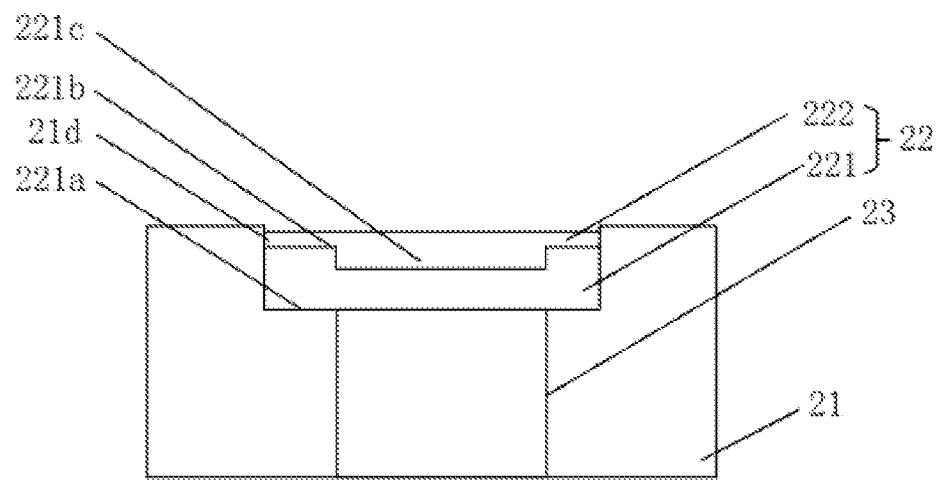
FIG. 9I illustrates a ninth process flow diagram of a method for forming a semiconductor structure according to embodiments of the disclosure.

In an embodiment, the second bonding structure 22 further includes a fourth metal layer 222 formed on the third metal layer 221, as shown in FIG. 9I.

In the embodiment, forming the second bonding structure 22 includes: forming a fourth groove 221c on the fourth surface 221b of the third metal layer 221, in which an area, not occupied by the third metal layer 221 and the fourth groove 221c, of the second opening 21c constitutes a fifth groove 21d; and forming a fourth metal layer 222 in the fourth groove 221c and the fifth groove 21d, in which the material of the fourth metal layer 222 is the same as that of a second metal layer 122, and the surface, exposed from the fifth groove 21d, of the fourth metal layer 222 constitutes a bonding surface of the second bonding structure 22.

In an embodiment, the method for a semiconductor structure further includes: forming a second conductive via hole 23 in the second substrate 21, in which the second conductive via hole 23 is connected to the second bonding structure 22.

After the second bonding structure 22 is completed, the second bonding structure 22 is bonded to the first bonding structure 12.

Figure 9J:
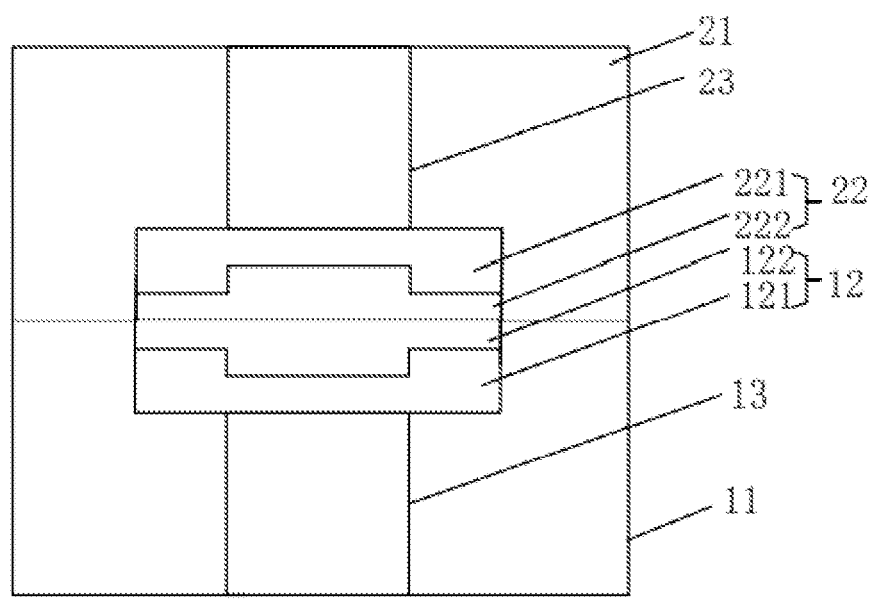
FIG. 9J illustrates a tenth process flow diagram of a method for forming a semiconductor structure according to embodiments of the disclosure.

In an embodiment, bonding of the second bonding structure 22 to the first bonding structure 12 includes: bonding and connecting the surface, exposed from a fifth groove 21d, of the fourth metal layer 222 with the surface, exposed from the second groove 11d, of the second metal layer 122, as shown in FIG. 9J.

In an embodiment, bonding of the second bonding structure 22 to the first bonding structure 12 includes: bonding and connecting the fourth surface 221b of the third metal layer 221 with the surface, exposed from a second groove 11d, of the second metal layer 122.

The above description is only for the purpose of illustrating the preferred embodiments of the disclosure and is not intended to limit the scope of the disclosure, and any modifications, equivalents, improvements, etc. made within the spirit and principle of the disclosure should be included in the scope of the disclosure.

What is claimed is:

1. A semiconductor structure, comprising:
   a first substrate, a first opening being provided on a surface of the first substrate; and
   a first bonding structure, positioned in the first opening, wherein the first bonding structure comprises a first metal layer and a second metal layer with a melting point lower than that of the first metal layer, the first metal layer comprises a first surface in contact with a bottom surface of the first opening and a second surface opposite to the first surface, the second surface is provided with a first groove, an area, not occupied by the first metal layer and the first groove, of the first opening constitutes a second groove, a third groove below the first groove, a projection of the first groove on the first surface falls within a projection of the third groove on the first surface, a projection of the second groove on the first surface coincides with the projection of the third groove on the first surface; the second metal layer is formed in the first groove, the second groove and the third groove, and a surface, exposed from the second groove, of the second metal layer constitutes a bonding surface of the first bonding structure.

2. The semiconductor structure of claim 1, further comprising:
   a first conductive via hole positioned in the first substrate, wherein the first conductive via hole is connected to the first bonding structure, and a projection of the first conductive via hole and a projection of the first groove on the first surface in a direction perpendicular to the first surface coincide.

3. The semiconductor structure of claim 1, wherein the first metal layer comprises at least one of copper or tungsten, and the second metal layer comprises at least one of bismuth, cadmium, tin, lead, dysprosium, and indium.

4. The semiconductor structure of claim 1, wherein a shape of the bonding surface of the first bonding structure comprises circular, oval, or rectangular ones.

5. The semiconductor structure of claim 1, wherein an opening shape of the first groove comprises circular or rectangular ones; and an outer contour shape of the second surface of the first metal layer comprises circular or rectangular ones.

6. The semiconductor structure of claim 1, further comprising:
   a second substrate, a second opening being provided on a surface of the second substrate; and
   a second bonding structure, positioned in the second opening and used for bonding and connecting with the first bonding structure.

7. The semiconductor structure of claim 6, wherein the second bonding structure comprises a third metal layer, and a material of the third metal layer is a same as that of the first metal layer, wherein the third metal layer comprises a third surface in contact with a bottom surface of the second opening and a fourth surface opposite to the third surface.

8. The semiconductor structure of claim 7, wherein the fourth surface of the third metal layer constitutes a bonding surface of the second bonding structure, the fourth surface of the third metal layer has a concave shape and is bonded and connected with the bonding surface of the first bonding structure.

9. The semiconductor structure of claim 7, wherein the second bonding structure further comprises a fourth metal layer, a material of the fourth metal layer is a same as that of the second metal layer; and
   the fourth surface of the third metal layer is provided with a fourth groove, an area, not occupied by the third metal layer and the fourth groove, of the second opening constitutes a fifth groove, the fourth metal layer is positioned in the fourth groove and the fifth groove, and a surface, exposed from the fifth groove, of the fourth metal layer constitutes a bonding surface of the second bonding structure.

10. The semiconductor structure of claim 9, wherein the bonding surface of the first bonding structure and the bonding surface of the second bonding structure have a same shape and area.

11. The semiconductor structure of claim 9, wherein the fourth metal layer does not completely fill the fifth groove, and a distance between a surface, exposed from the fifth groove, of the fourth metal layer and the surface of the second substrate is 1 nm-5 nm.

12. A method for forming a semiconductor structure, comprising:
   providing a first substrate, a first opening being formed on a surface of the first substrate; and forming a first bonding structure in the first opening, the first bonding structure comprising a first metal layer and a second metal layer with a melting point lower than that of the first metal layer; wherein said forming the first bonding structure comprises: forming the first metal layer in the first opening, the first metal layer comprising a first surface in contact with a bottom surface of the first opening and a second surface opposite to the first surface; forming a first groove on the second surface, an area, not occupied by the first metal layer and the first groove, of the first opening constituting a second groove; forming a third groove below the first groove of the first metal layer, wherein a projection of the first groove on the first surface falls within a projection of the third groove on the first surface, a projection of the second groove on the first surface coincides with the projection of the third groove on the first surface; and forming the second metal layer in the first groove, the second groove and the third groove, a surface, exposed from the second groove, of the second metal layer constituting a bonding surface of the first bonding structure.

13. The method for forming a semiconductor structure of claim 12, further comprising:
forming a first conductive via hole in the first substrate, wherein a projection of the first conductive via hole and a projection of the first groove on the first surface in a direction perpendicular to the first surface coincide.

14. The method for forming a semiconductor structure of claim 12, further comprising:
providing a second substrate, a second opening being formed on a surface of the second substrate;
forming a second bonding structure in the second opening;
and bonding and connecting the second bonding structure with the first bonding structure.

15. The method for forming a semiconductor structure of claim 14, wherein
said forming the second bonding structure comprises: forming a third metal layer, wherein a material of the third metal layer is the same as that of the first metal layer, and the third metal layer comprises a third surface in contact with a bottom surface of the second opening and a fourth surface opposite to the third surface.

16. The method for forming a semiconductor structure of claim 15, wherein
said forming the second bonding structure further comprises: forming a fourth groove on the fourth surface of the third metal layer, an area, not occupied by the third metal layer and the fourth groove, of the second opening constituting a fifth groove; forming a fourth metal layer in the fourth groove and the fifth groove, wherein a material of the fourth metal layer is the same as that of the second metal layer; and a surface, exposed from the fifth groove, of the fourth metal layer constituting a bonding surface of the second bonding structure.

\* \* \* \* \*